(12) United States Patent
Kadotani et al.

(10) Patent No.: US 8,154,037 B2
(45) Date of Patent: Apr. 10, 2012

(54) LIGHT-EMITTING DIODE LIGHT SOURCE APPARATUS

(75) Inventors: Norikazu Kadotani, Tsu (JP); Koichi Fukasawa, Fuefuki (JP); Sadato Imai, Minamitsuru-gun (JP)

(73) Assignees: Citizen Electronics Co., Ltd., Yamanashi (JP); Citizen Holdings Co., Ltd., Tokyo (JP)

( * ) Notice: Subject to any disclaimer, the term of this patent is extended or adjusted under 35 U.S.C. 154(b) by 21 days.

(21) Appl. No.: 12/840,800

(22) Filed: Jul. 21, 2010

(65) Prior Publication Data

US 2011/0019420 A1 Jan. 27, 2011

(30) Foreign Application Priority Data

Jul. 21, 2009 (JP) ................................. 2009-170453

(51) Int. Cl.
*H01L 27/15* (2006.01)
(52) U.S. Cl. ............ 257/97; 257/81; 257/712; 313/498; 313/505; 362/249.02
(58) Field of Classification Search ............ 362/249.02, 362/249.03, 800; 257/81, 82, 712; 313/498, 313/505
See application file for complete search history.

(56) References Cited

U.S. PATENT DOCUMENTS

| 6,999,318 | B2 * | 2/2006 | Newby ........................... 361/719 |
| 7,201,511 | B2 * | 4/2007 | Moriyama et al. ............ 362/646 |
| 7,560,748 | B2 * | 7/2009 | Ishizaka et al. ................. 257/99 |
| 7,872,278 | B2 * | 1/2011 | Stoyan ........................... 257/99 |
| 2004/0089898 | A1 * | 5/2004 | Ruhnau et al. ................ 257/343 |

FOREIGN PATENT DOCUMENTS

JP 2006-295085 A1 10/2006

* cited by examiner

*Primary Examiner* — Ali Alavi
(74) *Attorney, Agent, or Firm* — Browdy and Neimark, PLLC

(57) ABSTRACT

An LED light source apparatus comprises a circular base having thermal conductivity, an insulative substrate concentric with the base and including a pass-through hole provided to pass through an upper surface and a lower surface of the substrate, at least one mounting area formed having a central portion of an upper surface of the base exposed from the pass-through hole of the substrate, and a plurality of LED elements mounted on the mounting area and electrically connected to electrodes provided on the upper surface of the substrate, the pass-through hole being formed in a circular shape concentric with the base and the substrate.

12 Claims, 13 Drawing Sheets

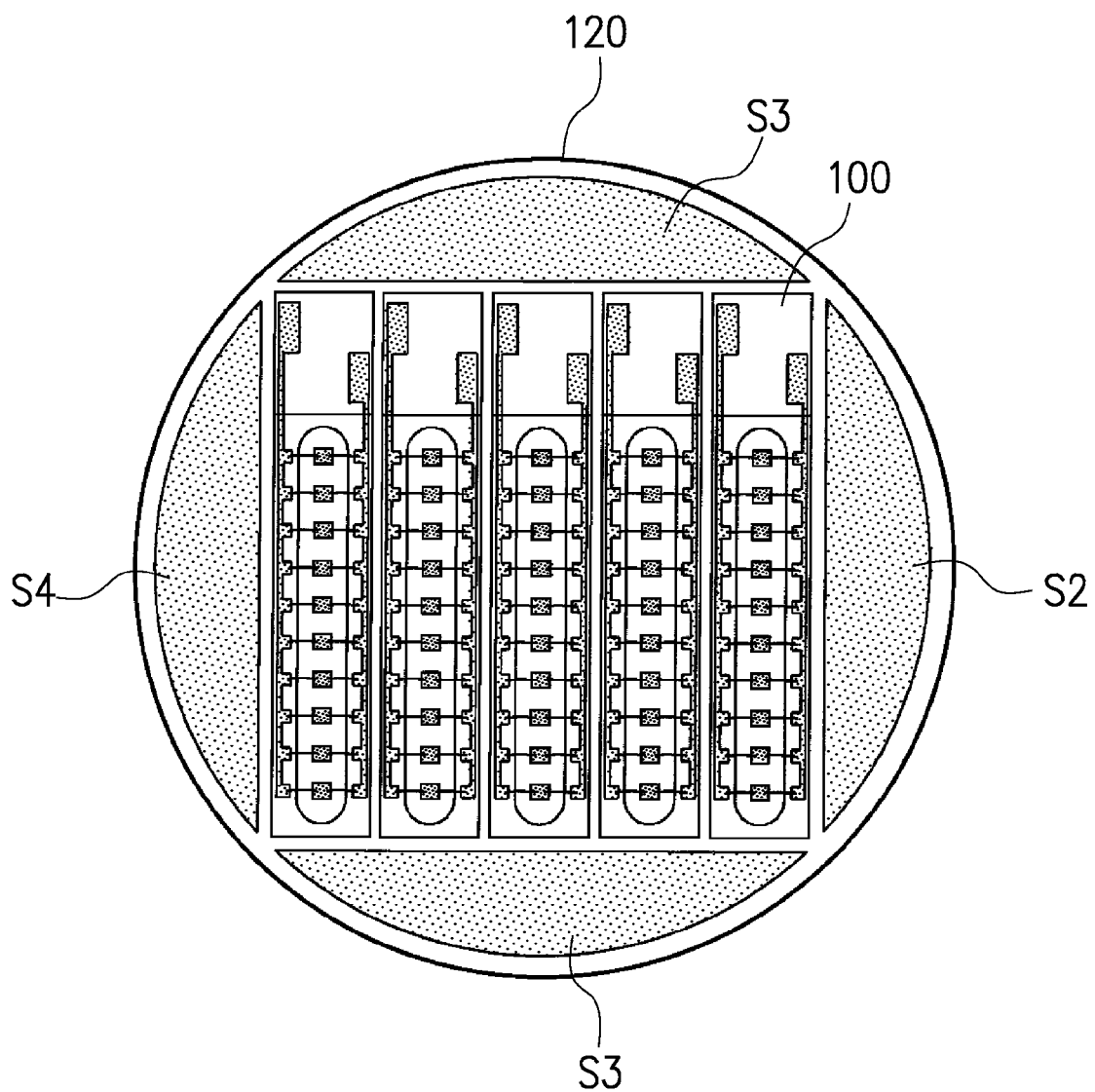

US 8,154,037 B2

LIGHT-EMITTING DIODE LIGHT SOURCE APPARATUS

CROSS-REFERENCE TO THE RELATED APPLICATION

The application is based on and claims the priority benefit of Japanese Patent Application No. 2009-170453, filed on Jul. 21, 2009, the disclosure of which is incorporated herein by reference in its entirety.

BACKGROUND OF THE INVENTION

1. Field of the Invention

The present invention relates to a light-emitting diode light source apparatus configured as an assembly of a plurality of light-emitting diode elements and able to be used as a light source in various kinds of lighting.

2. Description of the Related Art

Conventionally, an LED (LIGHT-EMITTING DIODE) element, which is a compound semiconductor, has been widely used as a light source apparatus, taking advantage of its features of long operating life and potential for miniaturization. Moreover, the development of a blue color emitting LED element formed from a gallium nitride system compound semiconductor or the like has led to advances in commercialization of a white color emitting or pseudo-white color emitting light source apparatus. Furthermore, a high brightness high output light source apparatus designed with consideration for heat dissipation of the LED element is also commercially available. In addition, since there is a limit to the amount of light emitted by a single LED element, there is disclosed an LED or LED light source unit in which a plurality of LED elements are electrically connected to a single substrate to obtain a greater amount of light (refer, for example, to JP 2006-295085 A).

FIG. 11 shows a conventional LED light source unit 100. This LED light source unit 100 is provided with an elongated insulating substrate 101, a plurality of LED elements 110 arranged in a line at intervals in a long direction of the insulating substrate 101, a metal plate (not shown) fastened to a lower surface of the insulating substrate 101, and so on, the plurality of LED elements being mounted on the metal plate. Provided on an upper surface of the insulating substrate 101 are a pair of electrode patterns 104 formed by printing or the like. This pair of electrode patterns 104 includes two electrodes 102a and 102b for external connection provided at respective one ends of the pair of electrode patterns 104, the electrode patterns extending in a line along the long direction of the insulating substrate 101 on both sides of the plurality of LED elements 110 from the respective electrodes 102a and 102b, convex portions 103a and 103b for wire bonding to the LED elements 110 being formed on the electrode patterns on both sides of each of the LED elements 110.

The plurality of LED elements 110 are connected to the adjacent convex portions 103a and 103b by wires 111. As a result, each of the LED elements 110 is connected in parallel to the two electrodes 102a and 102b for external connection. When a drive voltage is supplied to the electrodes 102a and 102b, a drive current flows in each of the LED elements 110, whereby all of the LED elements 110 light up concurrently. Each of the LED elements 110 is sealed by a light-transmitting sealing resin 105, for example, and thereby mechanically and electrically protected.

The above-described conventional LED light source unit 100 has the plurality of LED elements 110 disposed in a line and can simultaneously light up the plurality of LED elements 110, and thus allows a relatively large amount of emitted light to be obtained. In addition, this conventional LED light source unit 100 allows a wide variety of forms of light sources to be easily formed by, for example, disposing a plurality of the LED light source units in a line, or two-dimensionally.

However, with the above-described conventional LED light source unit 100, the plurality of LED elements 110 are disposed in a line and the light emitting area thus becomes an elongated rectangular shape. Although optical design is made relatively easy by aligning a plurality of the above-described elongated rectangular LED light source units 100 to form a light emitting area of substantially square shape, gaps occur between the LED light source units 100 when aligned in plurality, the LED light source units 100 being separate bodies, which makes it difficult to increase the density of LED elements overall and is a barrier to obtaining a light source apparatus of higher lumen density.

Moreover, assuming the case where a lighting apparatus is installed with LED light source units 100 having a square shaped external shape as described above, since a lighting apparatus is generally bulb-shaped of substantially spherical shape, internal space efficiency of the lighting apparatus deteriorates leading to increased size of the lighting apparatus.

FIG. 12 shows in frame format one example of the case where a plurality of the conventional elongated rectangular LED light source units 100 are disposed two-dimensionally and installed on a base of a bulb-shaped lighting apparatus as a square shape compound light source unit. As shown in FIG. 12, five elongated rectangular LED light source units 100 are aligned to form the square shape compound light source unit, the compound light source unit being disposed inside a supporting frame 120 which is a portion of the base of the bulb-shaped lighting apparatus, the bulb-shaped lighting apparatus having a circular cross-sectional shape. Now, this leads to semicircular wasted spaces S1-S4 being formed in four places between the compound light source unit which is square and the supporting frame 120 which is circular as shown, and it can be understood that space efficiency with the square shape of LED light source units 100 is poor. Due to the above, and in consideration of the shape of the conventional lighting apparatus, there is need for a high brightness high output LED light source apparatus of easy optical design, high lumen density, and good space efficiency.

SUMMARY OF THE INVENTION

An object of the present invention is to provide an LED light source apparatus of easy optical design, high lumen density, and good space efficiency, which is suitable for a bulb-shaped lighting apparatus.

To achieve the above-described object, an LED light source apparatus in accordance with an embodiment of the present invention comprises: a base including an upper surface, a lower surface opposite the upper surface, and a peripheral edge side surface provided between edges of the upper surface and the lower surface, and having thermal conductivity; and a substrate including an upper surface provided with at least one pair of electrode patterns, a lower surface opposite the upper surface, and a pass-through hole provided to pass through the upper surface and the lower surface, the lower surface of the substrate being attached to the upper surface of the base. The base, the substrate, and the pass-through hole of the substrate each have a concentric circular shape. In addition, the LED light source apparatus in accordance with the embodiment of the present invention comprises: at least one circular mounting area that is an exposed portion of the upper surface of the base exposed from the circular pass-through hole of the substrate; and a plurality of LED elements mounted on circular mounting area of the base and electrically connected to the electrode patterns provided on the upper surface of the substrate.

In an embodiment of the present invention, along with the mounting area and the substrate being circular, at least a portion of the electrode patterns is formed in a ring shape that is concentric with the substrate.

In addition, in an embodiment of the present invention, a certain number of the LED elements may be electrically connected in series to the first and second electrodes to configure one of a plurality of units. The plurality of the units are disposed in parallel and electrically connected to the first electrode and the second electrode in parallel. Also, at least one of the units may be shifted with respect to adjacently disposed units for uniform light. Adjacently disposed three LED elements in adjacently disposed two units may be disposed with their respective centers positioned at vertexes of a triangle.

BRIEF DESCRIPTION OF THE DRAWINGS

FIG. 12 is a plan view showing an example of a bulb-shaped lighting apparatus in which a plurality of the conventional LED light source units as shown in FIG. 11 is installed.

DETAILED DESCRIPTION OF THE PREFERRED EMBODIMENTS

Preferred embodiments of the present invention are now described in detail with reference to the accompanying drawings.

Figure 1:
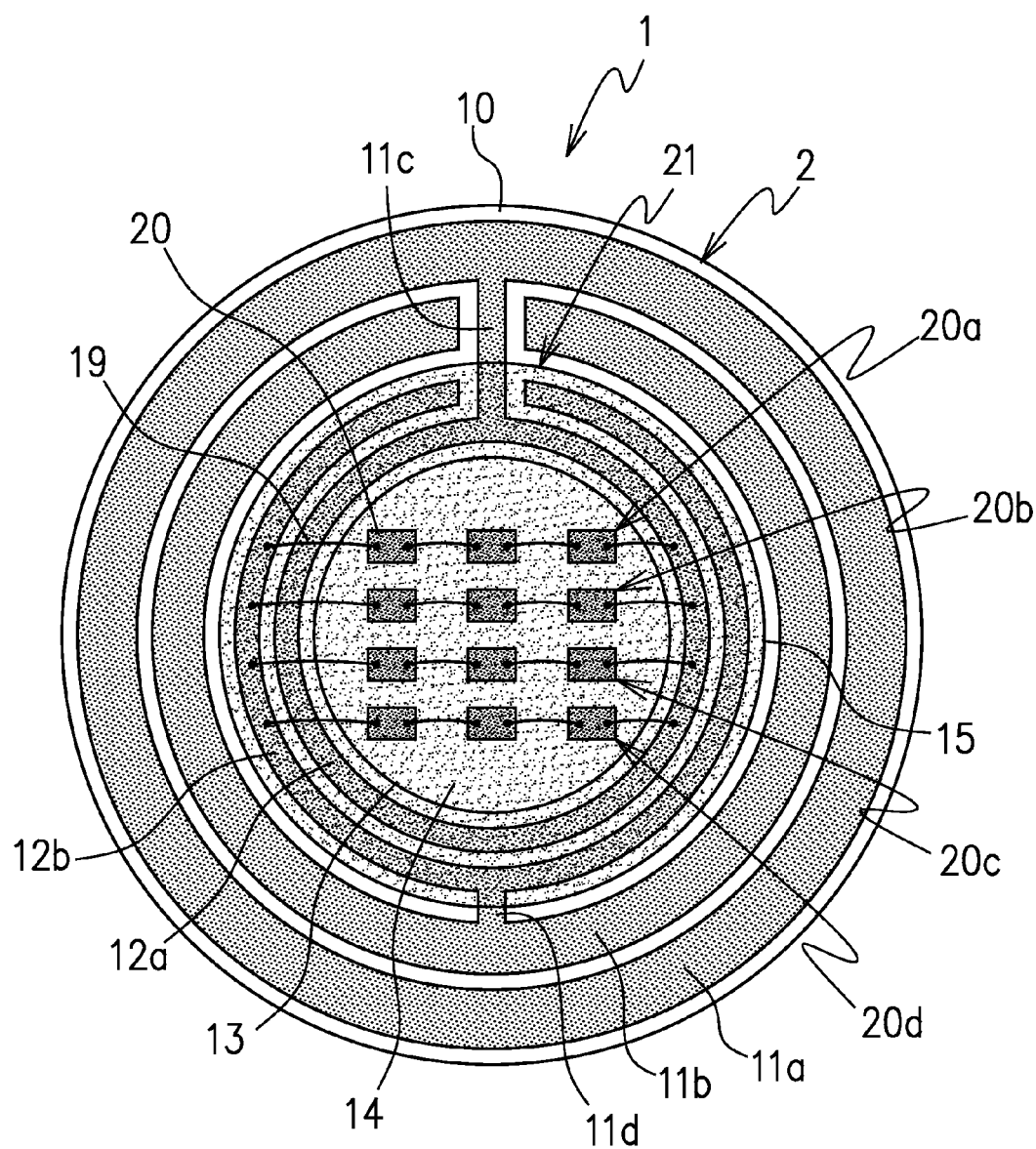
FIG. 1 is a plan view of an LED light source apparatus in accordance with an embodiment of the present invention.
Figure 2:
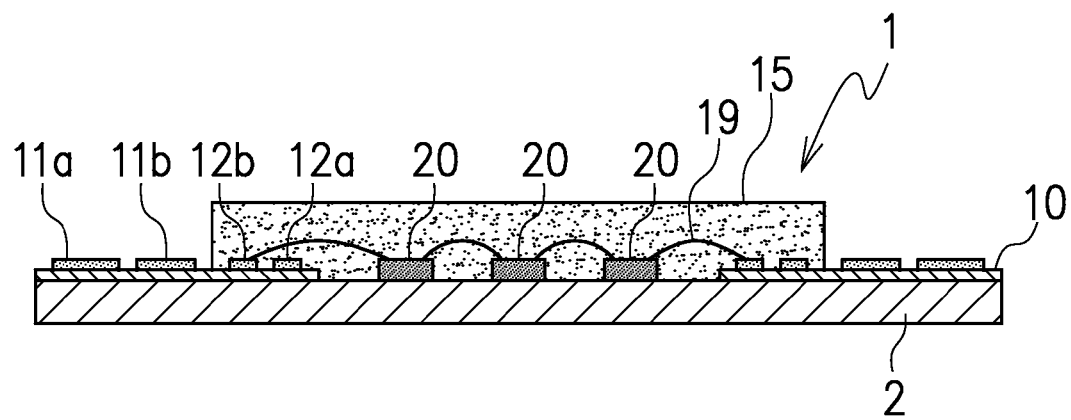
FIG. 2 is a side view of the LED light source apparatus.
Figure 3:
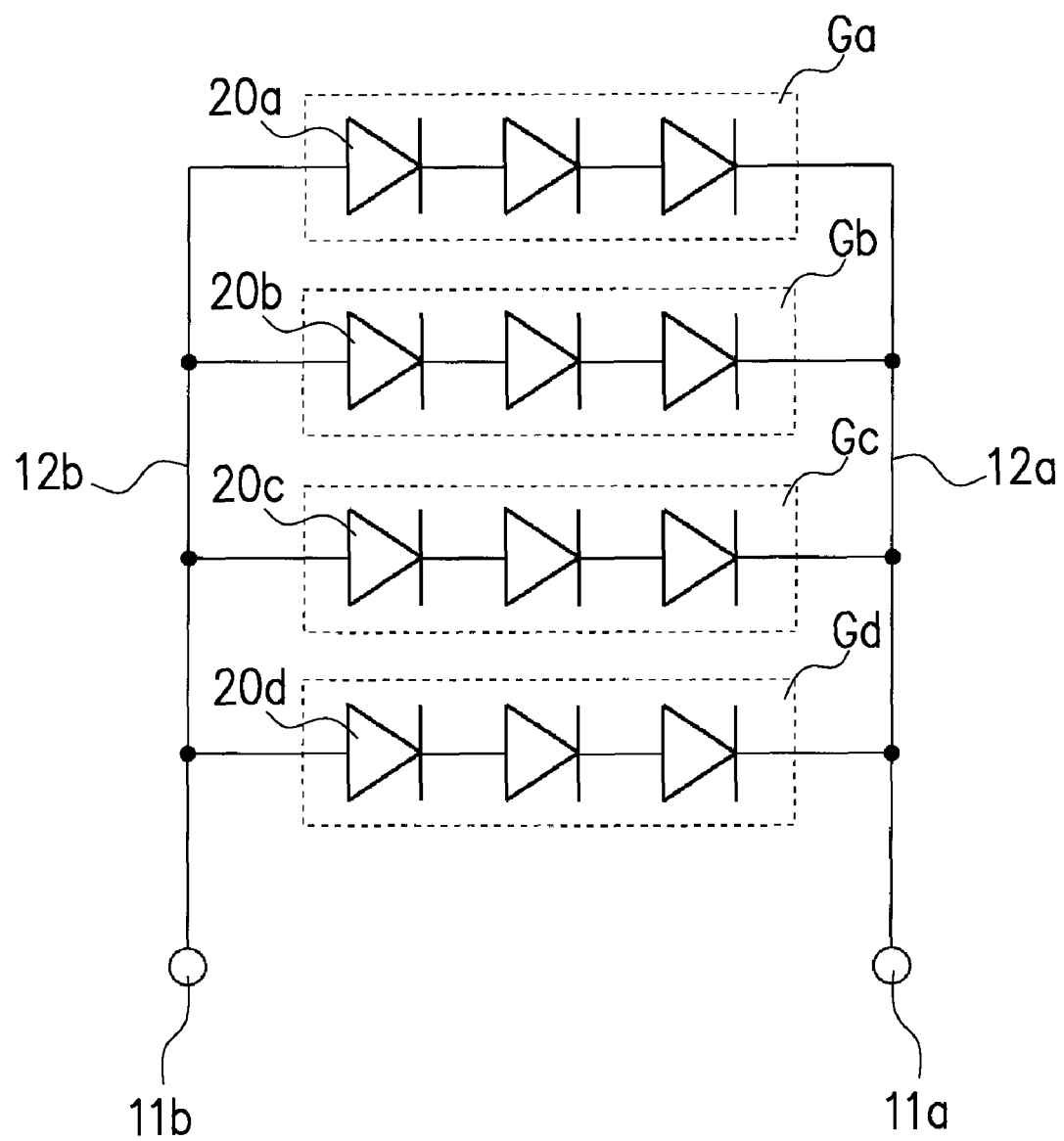
FIG. 3 is a circuit diagram explaining connection of LED elements in the LED light source apparatus.

FIGS. 1-3 show an LED light source apparatus 1 in accordance with an embodiment of the present invention. The LED light source apparatus 1 in accordance with the embodiment has a light emitting area, at least one circular mounting area provided inside the light emitting area, the circular mounting area that is an exposed portion of the upper surface of the base exposed from a pass-through hole of a substrate, and a plurality of LED elements are mounted on the mounting area of the base that is exposed in the pass-through hole in a shape of circular shape.

More specifically, the LED light source apparatus 1 including a base 2 having an upper surface, a lower surface opposite the upper surface, and a peripheral edge side surface provided between edges of the upper surface and the lower surface, and the base 2 having thermal conductivity, a plate-shaped substrate 10 which is thinner than thickness of each of the LED elements and insulative, the substrate 10 including an upper surface provided with at least one pair of electrode patterns formed by printing or the like, a lower surface opposite the upper surface, and a pass-through hole provided to pass through the upper surface and the lower surface, the lower surface of the substrate 10 being firmly fixed to the upper surface of the base 2, a plurality of LED elements 20 mounted on the mounting area which is the upper surface of the base 2 in the pass-through hole 13 of the substrate, and so on.

The base 2 is configured from a metal material provided with high thermal conductivity such as, for example, an aluminum plate. At least the upper surface of the base 2 is flat, and the base 2 has a circular shape in top plan view.

The substrate 10 is a printed circuit board formed by a material such as a BT resin having good insulating properties or a glass epoxy material, for example, and has a circular external shape substantially identical to the external shape of the base 2. The substrate 10 is fixed firmly in an integrated manner to the upper surface of the base 2 using an adhesive (not shown) or the like, such that central points of the substrate 10 and the base 2 are aligned with each other. As a result, the base 2 and the substrate 10 are concentric.

Provided in a central portion of the substrate 10 is a circular pass-through hole 13 passing through the upper surface and the lower surface of the substrate 10. This circular pass-through hole 13 is concentric with the substrate 10, resulting in the upper surface at a central portion of the base 2 being largely exposed. This exposed area of the upper surface of the base 2 is the mounting area 14, and the plurality of LED elements 20 are directly mounted on the base 2 in the pass-through hole of the substrate.

Moreover, the at least one pair of electrode patterns formed on the upper surface of the substrate 10 are formed by copper foil or the like. The electrode patterns include a first electrode 12a which is disposed to surround the circular mounting area 14 and has a ring shape, a second electrode 12b which is disposed to surround the first electrode 12a and has a ring shape with a gap in a middle of the ring shape, a third electrode 11b which is disposed to surround the second electrode 12b and has a ring shape with a gap in a middle of the ring shape, the third electrode 11b being electrically connected to the second electrode 12b, and a fourth electrode 11a having a ring shape and disposed to surround the third electrode 11b, the fourth electrode 11a electrically connected to the first electrode 12a.

The first electrode 12a and the fourth electrode 11a each have a ring shape concentric with the base 2, the substrate 10 and the pass-through hole 13 of the substrate 10; moreover, the second electrode 12b and the third electrode 11b have a ring shape concentric with the base 2, the substrate 10 and the pass-through hole 13 of the substrate 10, the ring shape including a gap in a middle of the ring shape.

In addition, the electrode patterns include a connecting electrode 11c that runs through the gaps of the second electrode 12b and the third electrode 11b and electrically connects the first electrode 12a and the fourth electrode 11a. Note that of the plurality of the LED elements, some of the LED elements 20 are electrically connected in series to the first electrode 12a and the second electrode 12b to configure one of a plurality of units. The plurality of the units are disposed in parallel and electrically connected to the first electrode and the second electrode in parallel. The LED elements in each unit are electrically connected by wires 19 and electrically connected to the first and second electrodes by wires 19, which are thin metal wires. The third electrode 11b and the fourth electrode 11a that are positioned outside of the light-emitting area are electrodes for external connection. In the present embodiment, the third electrode 11b and the fourth electrode 11a each have a width broader than a width of each of the first electrode 12a and the second electrode 12b.

Mounted in the circular-shaped mounting area 14 of the base 2 exposed in the upper surface of the substrate 10 via the pass-through hole 13 of the substrate 10 are the plurality of LED elements 20. The embodiment in FIG. 1 shows three LED elements 20 connected in series to the first electrode 12a and the second electrode 12b by the wires 19 to configure one series-connected unit, and four of these units aligned in parallel rows each other and connected in parallel to the first electrode 12a and the second electrode 12b. Here the three LED elements 20 in each unit are aligned in a lateral direction and the four units are aligned in a longitudinal direction of the FIG. 1, and there is a total of 12 LED elements 20 are mounted here, just as an example for explanation. Note that to distinguish the LED elements 20 of each of the units, the LED elements are respectively assigned notations 20a, 20b, 20c, and 20d, on a unit basis, from an upper row, whereas, when referring to all of the mounted LED elements or to an individual LED element, the notation 20 is adopted. In addition, the number of LED elements 20 is not limited to the number of the present embodiment and is selected arbitrarily based on specifications of the LED light source apparatus 1.

Next, connection of the LED elements 20 mounted in the mounting area 14 is described on the basis of FIG. 1. All of the LED elements 20 mounted on the mounting area of the base have respective cathodes facing in a first identical direction and anodes facing in a second identical direction that is opposite to the first identical direction; in one example, anode terminals (not shown) are positioned at the left side of each LED element in FIG. 1 and cathode terminals (not shown) are positioned at the right side in FIG. 1 are. In addition, predetermined spaces are provided between adjacent LED elements 20 and the LED elements 20 electrically connected in series to each other in each unit and electrically connected in series to the first electrode 12a and second electrode 12b by the wires 19, respectively.

That is, considering the three LED elements 20a mounted in the uppermost row of the mounting area 14 in FIG. 1, the leftmost LED element has its anode electrically connected to the second electrode 12b by the wire 19. In addition, the cathode of the leftmost LED element and the anode of the adjacent central LED element 20 are connected by the wire 19. Moreover, the cathode of the central LED element is connected to the anode of the rightmost LED element by the wire 19, and, furthermore, the cathode that is positioned at right side of the rightmost LED element is electrically connected to the first electrode 12a by the wire 19. In this way, the three LED elements 20a mounted in the uppermost row are connected in series between the first electrode 12a and the second electrode 12b by the wires 19.

The LED elements 20b, 20c, and 20d of the other three units, as well as of the above-mentioned unit of the uppermost row, are also connected in series between the first electrode 12a and the second electrode 12b by the wires 19. In this way, a configuration is achieved in which all of the LED elements 20 mounted in the mounting area 14 have three of the LED elements 20 in each unit connected in series by the wires 19 to configure one unit, and a plurality of these units aligned in parallel with each other and connected in parallel to the first electrode 12a and the second electrode 12b. Note that the reason a plurality of LED elements, for example a total of as many as 12 LED elements 20, can be mounted and connected within the mounting area 14 is because mounting density is increased by having neighboring LED elements 20 connected directly by the wires 19. Wiring of the LED elements 20a-20d is described in detail hereafter.

The plurality of LED elements 20 mounted in the mounting area 14 and the wires 19, as well as the first electrode 12a and the second electrode 12b, are sealed by a light-transmitting resinous member 15. This resinous member 15 is disc-shaped in top plan view and has its outer peripheral edge positioned between the second electrode 12b and the third electrode 11b. The resinous member 15 configures a light emitting area 21 of the LED elements 20. Note that the light emitting area 21 is preferably concentric with the substrate 10.

Next, a connection circuit of the plurality of LED elements 20 mounted in the mounting area 14 is described on the basis of FIG. 3. As previously mentioned, the LED elements 20 in the present embodiment are configured such that three of the LED elements are connected in series to the first electrode 12a and the second electrode 12b to configure one series-connected unit, and four rows of these units are aligned in parallel to be connected in parallel to the first electrode 12a and the second electrode 12b. More specifically, the LED elements 20 are arranged in four units, namely a unit Ga having the three LED elements 20a connected in series, a unit Gb having the three LED elements 20b connected in series to the electrodes, a unit Gc having the three LED elements 20c connected in series to the electrodes, and a unit Gd having the three LED elements 20d connected in series to the electrodes. Further, the LED elements 20a-20d of each of the units are electrically connected in parallel between the first electrode 12a and the second electrode 12b as previously mentioned (refer to FIG. 1).

In addition, since the first electrode 12a is electrically connected to the fourth electrode 11a and the second electrode 12b is connected to the third electrode 11b, the LED elements 20a-20d of each of the units Ga-Gd are, as a result, connected in parallel between the fourth electrode 11a and the third electrode 11b, as shown in FIG. 3.

As a result, when a certain drive voltage is applied to the fourth electrode 11a and the third electrode 11b, which are the electrodes for external connection, a drive current flows in all of the units Ga-Gd, whereby all of the LED elements 20 can be lighted up. Now, since a drive current of identical value flows in the series-connected individual LED elements of each of the units Ga-Gd, drive conditions for the LED elements within a unit are identical. Moreover, since each of the units Ga-Gd has three of the LED elements connected in series, variation in characteristics of individual LED elements is averaged, leading to a substantially identical drive current flowing in each of the units Ga-Gd.

In this way, the LED light source apparatus 1 of the present invention drives a large number of LED elements while adopting the basic configuration of connecting LED elements within each of the units in series using wires, and connecting a plurality of series-connected units in parallel. As a result, even when there are a large number of LED elements, the drive conditions for each of the LED elements is substantially identical, thus allowing variation in amount of light among the LED elements to be suppressed, and enabling an LED light source apparatus to be realized in which the light emitting pattern shows little bias, disturbance, or the like.

Supposing the case where all of the LED elements are connected in series, an identical drive current flows in all of the LED elements, and it is therefore possible to suppress variation in emitted light of the individual LED elements. However, if a large number of LED elements are connected in series, the drive voltage increases, thus necessitating a special drive circuit and leading to problems of economy and safety. In contrast, if all of the LED elements are connected in parallel, the drive voltage can be reduced, but there is a problem that variation in electrical characteristics of the LED elements leads to the drive current flowing in the individual LED elements differing greatly thereby generating a large variation in light emitted from the individual LED elements.

As is clear from the above, there are problems regarding connection of the LED elements with both series connection and parallel connection. However, the present invention, by dividing the large number of LED elements into units of a certain number of LED elements each and thereby combining series connection and parallel connection, provides the advantages that the drive voltage can be prevented from being raised to a high voltage, and that variation in the amount of light of the individual LED elements is suppressed. Note that in the present embodiment, one unit is configured by three LED elements and four rows of these units are connected in parallel, but the number of LED elements in one unit and the number of units connected in parallel are not limited by the present embodiment and are determined arbitrarily based on specifications of the LED light source apparatus.

Figure 4:
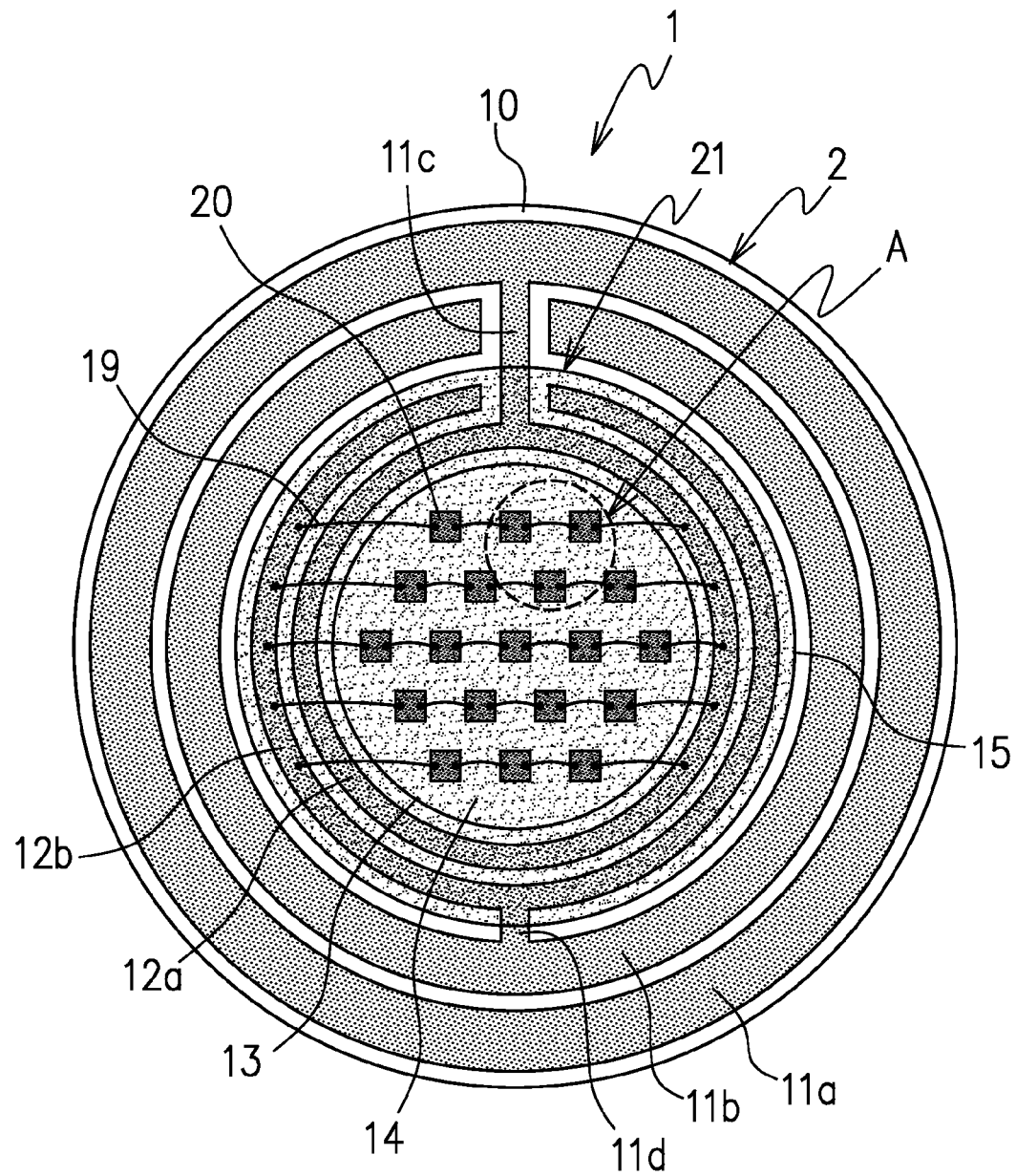
FIG. 4 is a plan view of an LED light source apparatus in which the LED elements are mounted, the LED light source apparatus having a disposition of the LED elements shifted on a unit basis.
Figure 5:
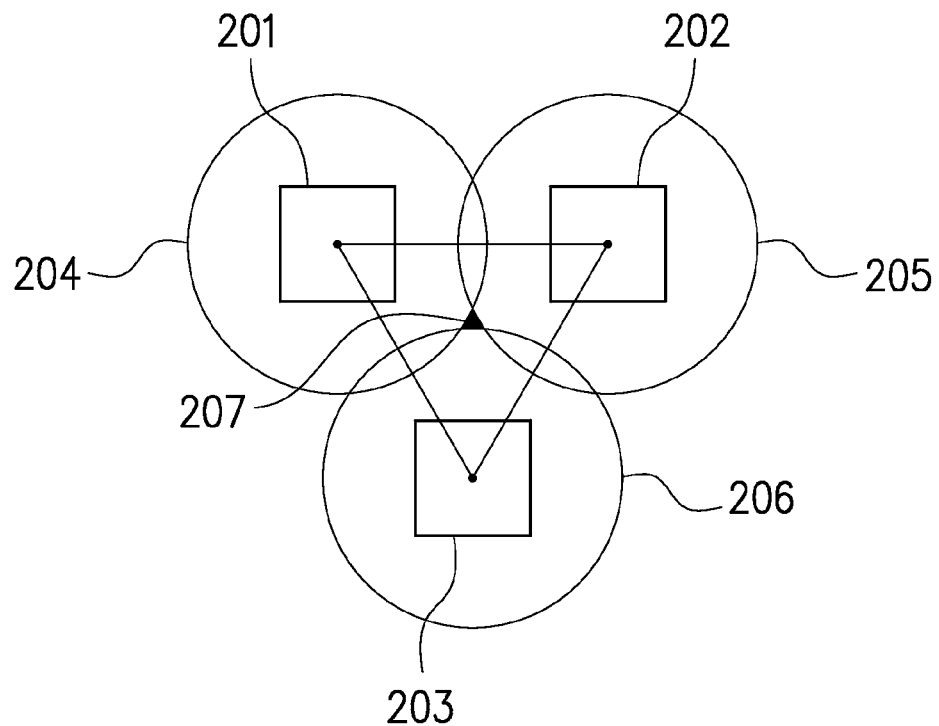
FIG. 5 is an enlarged view of portion A of FIG. 4.

FIGS. 4 and 5 have the plurality of LED elements mounted in the circular mounting area 14 disposed shifted on a unit basis. That is, the LED elements of a second row unit are disposed midway between the LED elements of a first row unit, and the LED elements of a third row unit are disposed midway between the LED elements of the second row unit. In this way, at least one of the units is shifted with respect to adjacently disposed units. In other words, positions of the adjacently disposed LED elements in adjacent units are shifted alternately.

In the case where the plurality of LED elements 20 mounted in the mounting area 14 are disposed as described above, and when considering three LED elements 201, 202, and 203 neighboring in an adjacent two rows as shown in FIG. 5, the adjacently disposed three LED elements are disposed with their respective centers positioned at vertexes of a triangle, whereby a weak-light region 207 not covered by same-brightness emitted light regions 204, 205, and 206 of each of the LED elements becomes small.

In particular, if the three LED elements are disposed such that lines joining each of central points $O_1$, $O_2$, and $O_3$ of each of the LED elements 201, 202, and 203 form an equilateral triangle, the weak-light region 207 becomes appreciably small. As a result, occurrence of portions of small light amount between the plurality of LED elements is avoided, and it becomes possible to obtain more uniform light.

Figure 6:
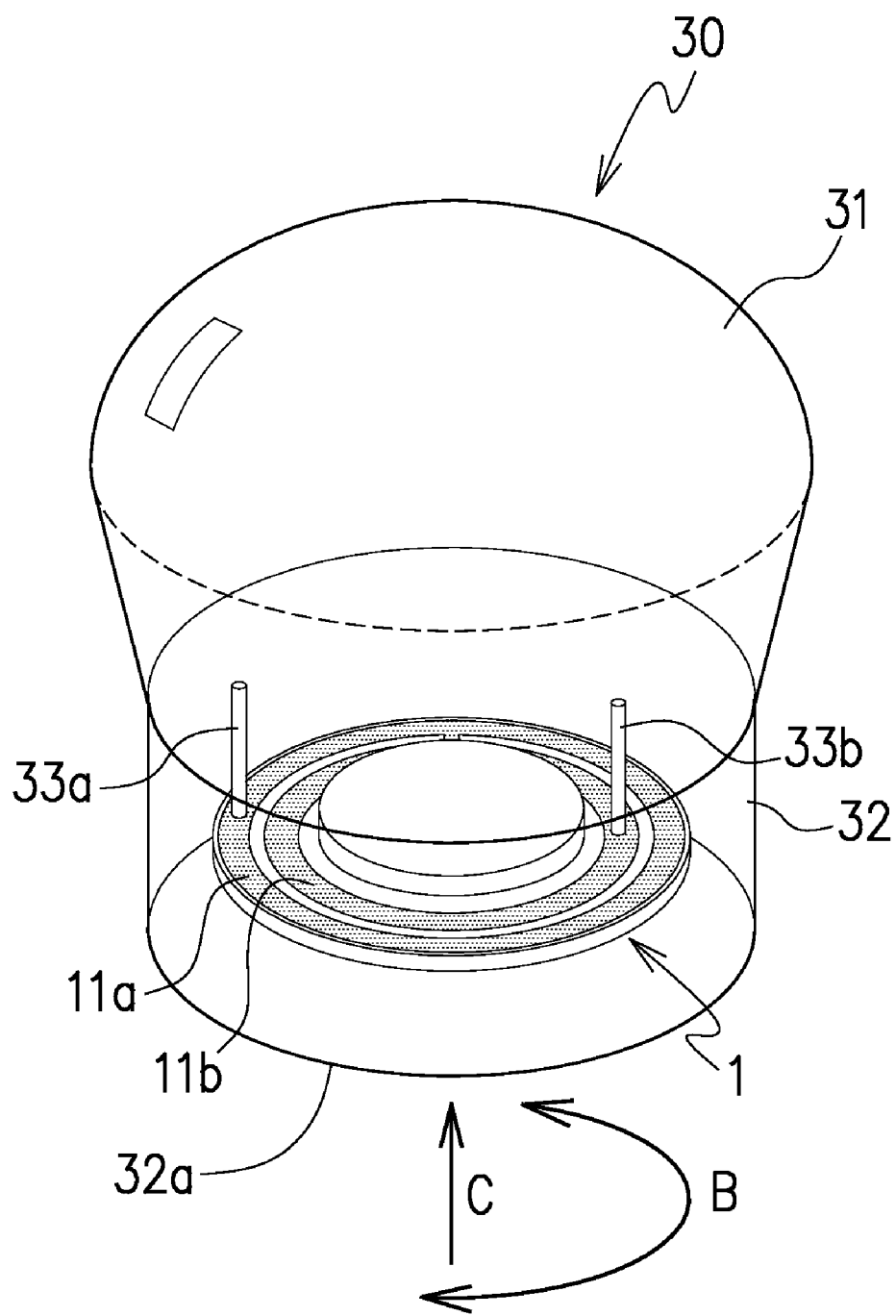
FIG. 6 is a perspective view of a lighting apparatus in which the LED light source apparatus is installed.

FIG. 6 shows a lighting apparatus 30 in which the LED light source apparatus 1 of the above-described configuration is installed. The lighting apparatus 30 shown here is formed as a so-called bulb-shaped by a substantially hemispherical light emitting portion 31 and a substantially cylindrical supporting portion 32 for supporting the light emitting portion 31, the LED light source apparatus 1 being installed in the supporting portion 32. Note that in FIG. 4, internal portions of the lighting apparatus 30 are shown transparently for convenience of description. Moreover, parts not required for the description are omitted from FIG. 4.

Disposed within the supporting portion 32 of the lighting apparatus 30 are two rod-shaped electrode members 33a and 33b, lower ends of the electrode members 33a and 33b being electrically in contact with each of the electrodes 11a and 11b of the LED light source apparatus 1, respectively. More specifically, the lower end of one of the electrode members 33a is in contact with the outwardly positioned fourth electrode 11a, and the lower end of the other of the electrode members 33b is in contact with the inwardly positioned third electrode 11b.

Figure 10:
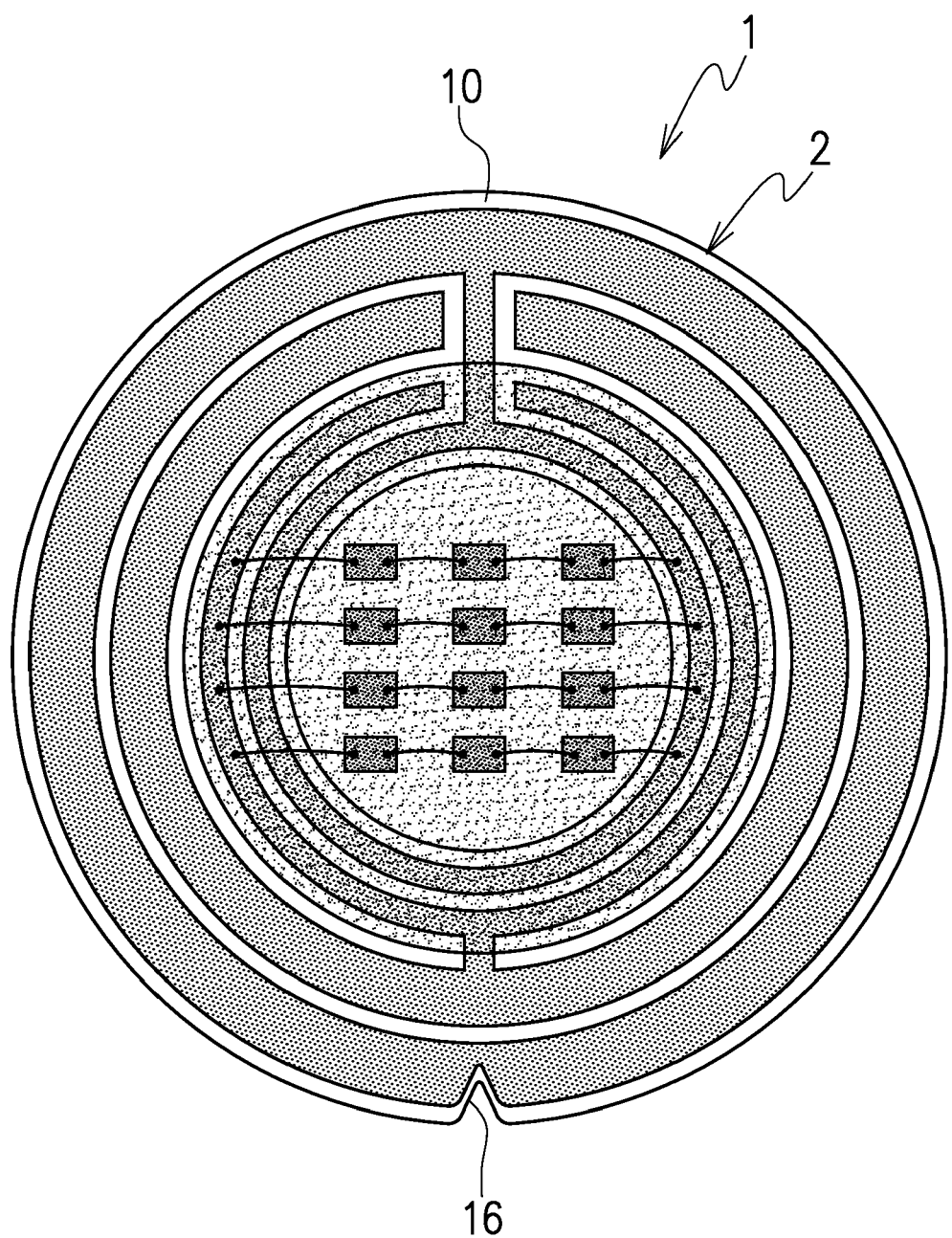
FIG. 10 is a plan view of an LED light source apparatus provided with a rotation preventing notch.
Figure 11:
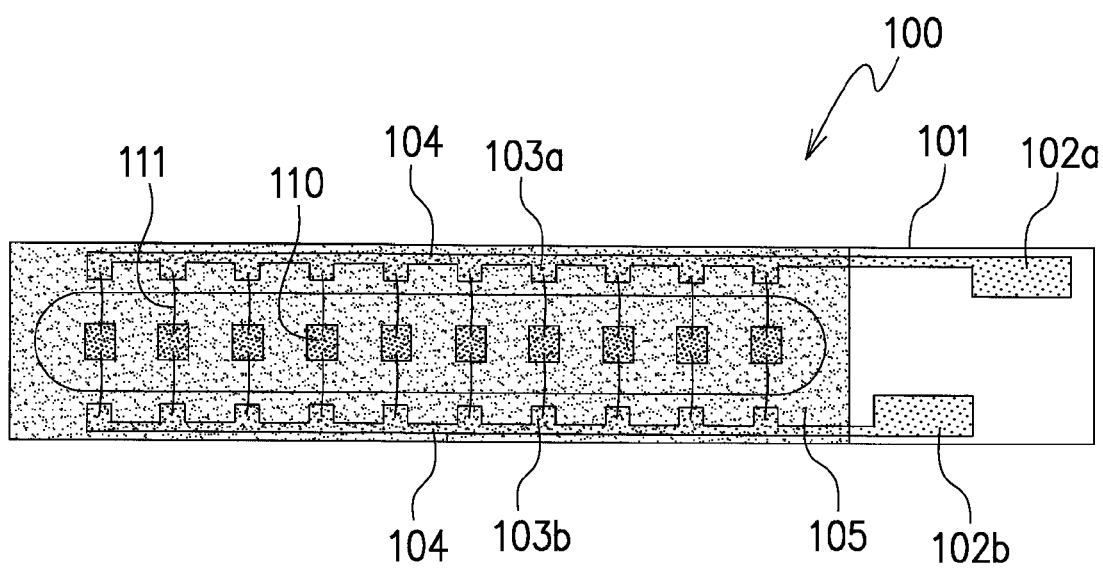
FIG. 11 is a plan view showing an example of a conventional LED light source unit.

For example, in the case where the LED light source apparatus 1 is installed from a lower surface portion 32a side of the supporting portion 32 in an arrow C direction as shown in FIG. 6, the fourth electrode 11a and third electrode 11b of the LED light source apparatus 1 are respectively brought into contact with and made electrically connecting with the lower ends of each of the electrode members 33a and 33b. The LED light source apparatus 1 is fixed to the supporting portion 32 in this state. The LED light source apparatus 1 can be fixed to the supporting portion 32 using a fastener such as a screw or clip (not shown), or, as shown in FIG. 10, by providing a positioning notch 16 at a portion of the outer peripheral edge of the base 2 and the substrate 10 of the LED light source apparatus 1 and causing the notch 16 to engage with a locking protrusion (not shown) provided on the supporting portion 32 side.

Note that, due to each of the fourth electrode 11a and third electrode 11b being formed in a ring shape, even if the LED light source apparatus 1 is installed in the lighting apparatus 30 while rotating in either of the directions shown by arrow B, there is no misalignment of a position of the fourth electrode 11a and third electrode 11b of the LED light source apparatus 1 with respect to the electrode members 33a and 33b.

Figure 7:
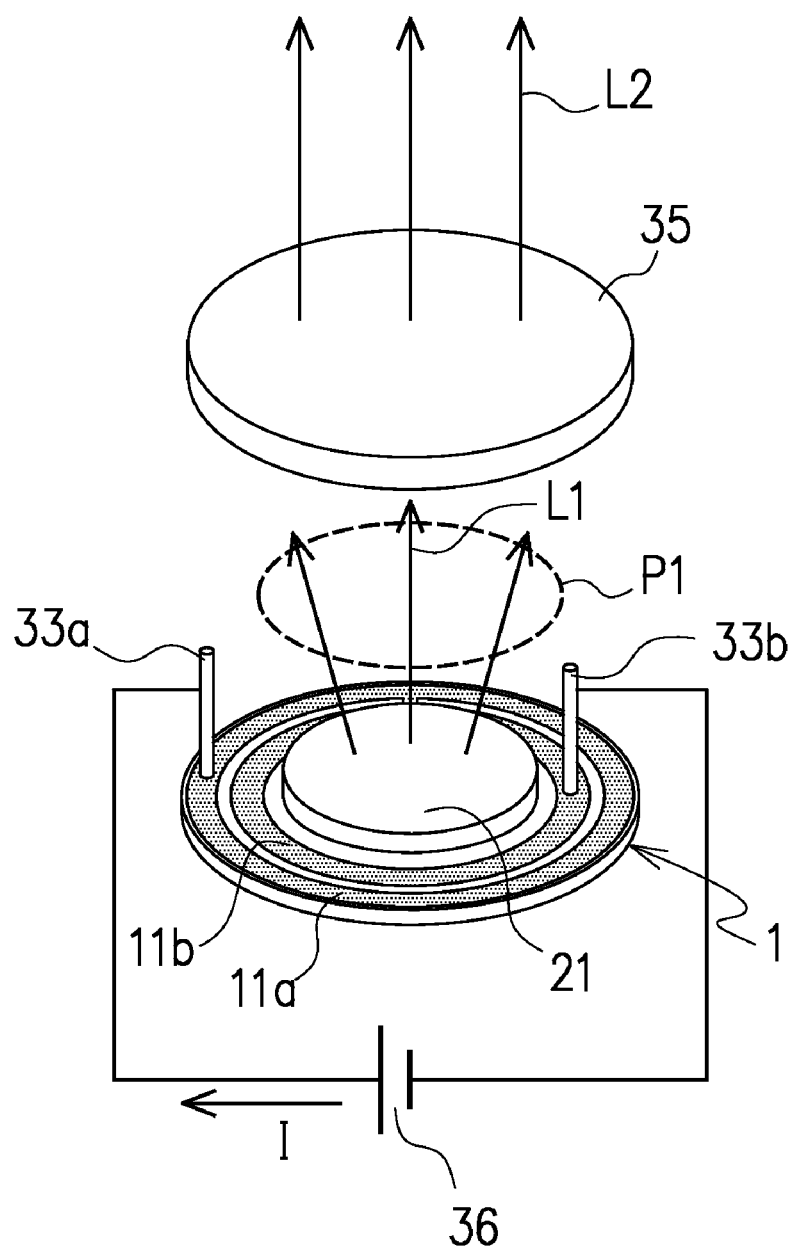
FIG. 7 is a perspective view explaining operation of the LED light source apparatus.

FIG. 7 shows operation of the LED light source apparatus 1 installed in the lighting apparatus 30. When an external drive power source 36 and the electrode members 33a and 33b are connected, a drive current I flows in the fourth electrode 11a and third electrode 11b of the LED light source apparatus 1, and all of the LED elements 20 (refer to FIG. 1) of the LED light source apparatus 1 light up to emit an emission light L1.

This emission light L1 is emitted as an emitted light pattern P1 (shown by the broken line) which is substantially circular in shape due to the light emitting area 21 of the LED light source apparatus 1 being circular, and is diffused while being emitted. The emission light L1 is further focused by a lens 35 disposed at a certain distance upward of the light emitting area 21 to form a substantially parallel emission light L2 and be emitted from the lens 35.

As is clear from the above, since the LED light source apparatus 1 of the present invention can emit the emission light L1 having an easily-focused highly-favorable emitted light pattern from a small circular light emitting area 21, optical design of the lens 35 and so on for focusing the emission light L1 is easy. As a result, a high brightness high output light source apparatus can be obtained having high lumen density, a small size, and good focusing capability. Note that the lens 35 is not limited to a focusing lens, and may be a diffusion-type lens for diffusing the emission light L1. Moreover, the emission light L1 may be emitted directly to external without passing through the lens 35.

Figure 8:
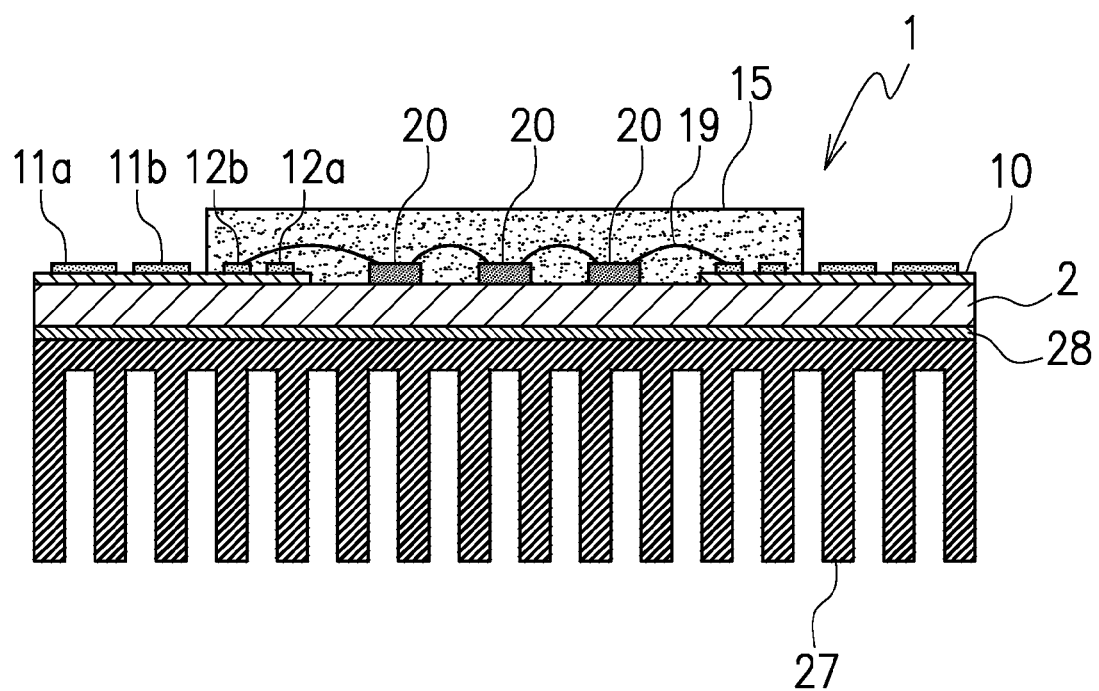
FIG. 8 is a side view in which a heat dissipation member is attached to the LED light source apparatus.

FIG. 8 shows an example in which a heat dissipation member is provided to an under side of the LED light source apparatus 1 in accordance with the above-described embodiment. Specifically, a heat sink 27 acting as the heat dissipation member is attached to the lower surface of the base 2 of the LED light source apparatus 1. When attaching the heat sink 27, it is preferable to apply silicone 28 between the heat sink 27 and the lower surface of the base 2, the silicone 28 having, for example, a filler of high heat conductivity dispersed therein. This has the advantage of filling a gap between the base 2 and the heat sink 27, both of which are metal, to eliminate an air layer between the base 2 and the heat sink 27, thereby strengthening adhesion of the base 2 and the heat sink 27 and increasing heat dissipation effect. In addition, for firm attachment, the LED light source apparatus 1 and the heat sink 27 may be fixed using screws, or the like (not shown).

By attaching a heat sink to the lower surface of the base 2, heat generated by the LED elements 20 mounted directly on a surface of the base 2 is efficiently transmitted to the base 2 of high thermal conductivity and further transmitted to the heat sink 27, thereby enabling the heat generated by the LED elements 20 to be efficiently dissipated. As a result, temperature rise in the LED elements 20 can be suppressed, and a high brightness high output LED light source apparatus 1 can be obtained having a long operating life and good reliability. Note that in FIG. 6 the heat sink 27 is shown to be the same size as the base 2 of the LED light source apparatus 1, but an external shape of the heat sink 27 is not limited to this configuration, and heat dissipation efficiency may be further raised by attaching a heat sink having an external shape larger than that of the LED light source apparatus 1.

Figure 9A:
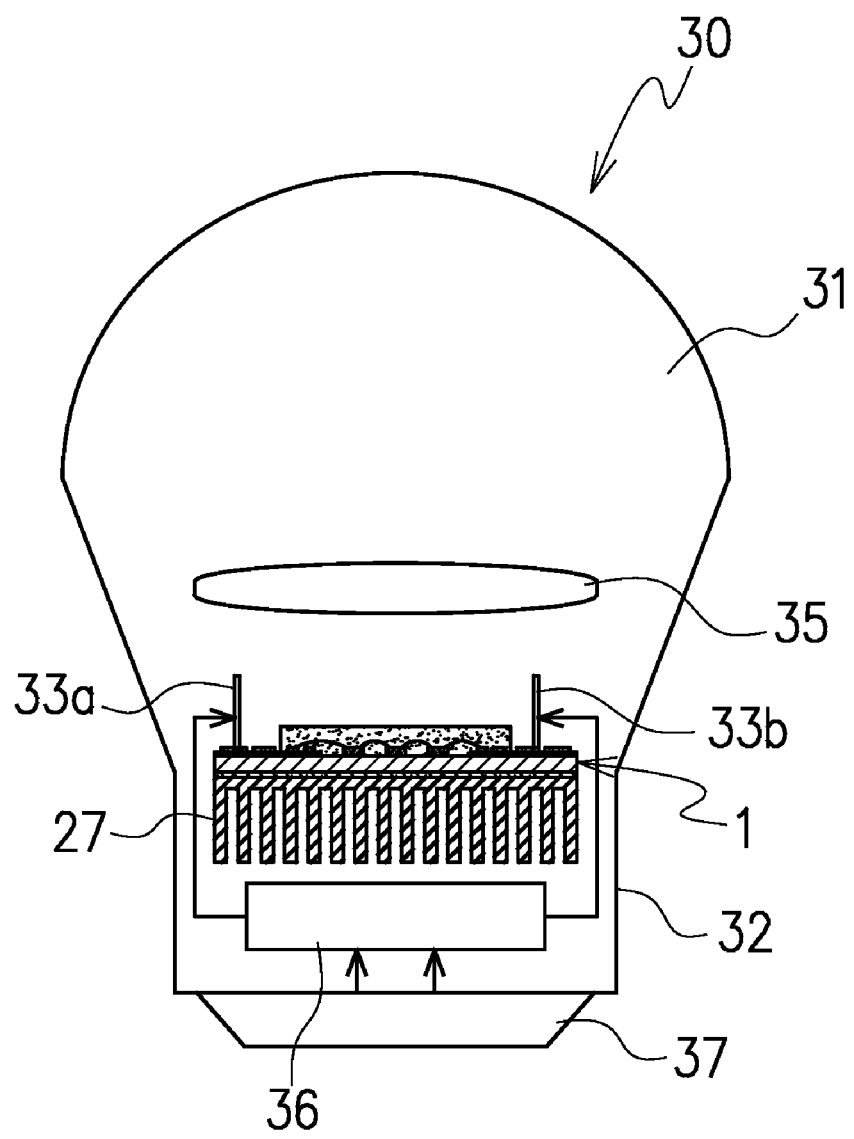
FIG. 9A is a side view of a bulb-shaped lighting apparatus in which the LED light source apparatus is installed.
Figure 9B:
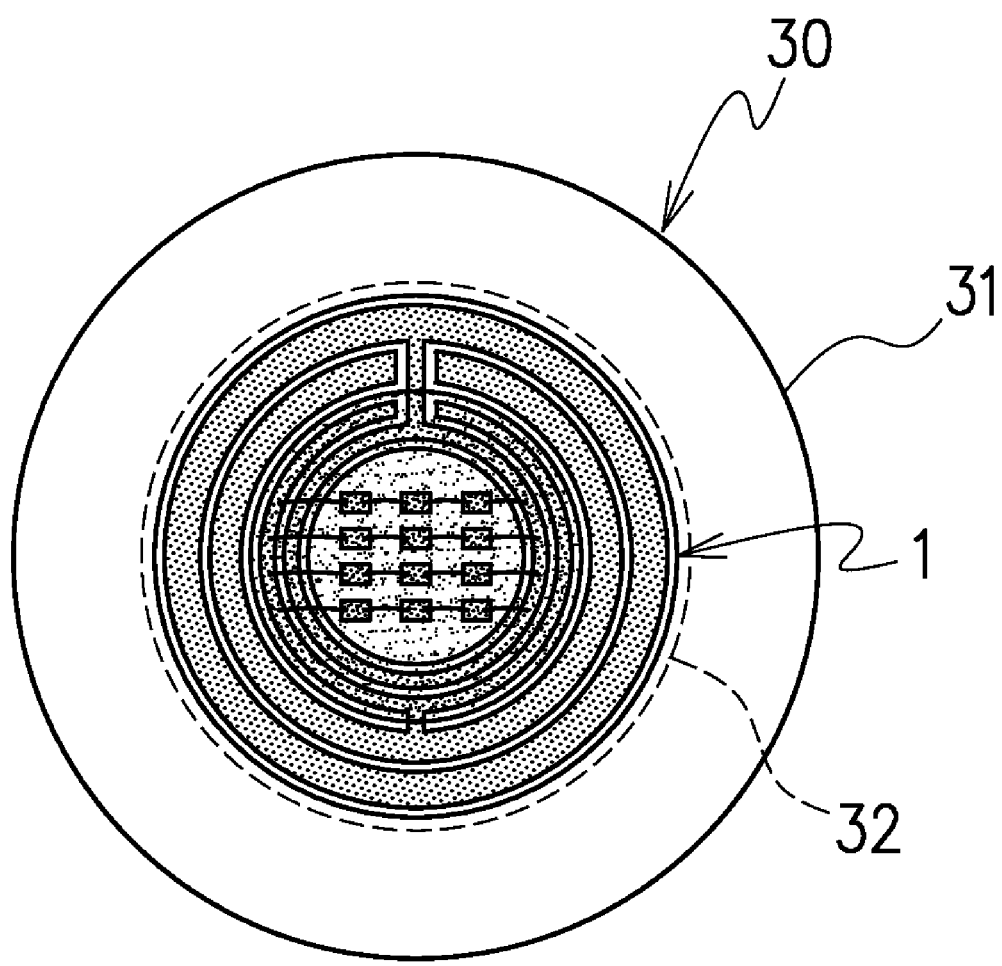
FIG. 9B is a plan view of the bulb-shaped lighting apparatus in which the LED light source apparatus is installed.

FIGS. 9A and 9B show a bulb-shaped lighting apparatus 30 installed with the LED light source apparatus 1 provided with the heat sink 27. This lighting apparatus 30 has an overall shape configured by the hemispherical light emitting portion 31 and the cylindrical supporting portion 32, similarly to the lighting apparatus shown in FIG. 6, the LED light source apparatus 1 being installed inside the supporting portion 32.

Provided on the lower surface portion of the supporting member 32 are external electrode terminals 37, supply of the external power source being received via these external electrode terminals 37. Disposed underneath the LED light source apparatus 1 is a drive power supply 36, the drive power supply 36 receiving supply of the external power source from the external electrode terminals 37. A direct current drive voltage is supplied from the drive power supply 36 via the electrode members 33a and 33b to the LED light source apparatus 1. Note that the lens 35 is provided upward of the LED light source apparatus 1.

As shown in FIG. 9B, the lighting apparatus 30 has an external shape which is circular in cross-section, therefore, if a rectangular shaped LED light source apparatus as in the conventional example is installed in this lighting apparatus, internal space efficiency of the lighting apparatus deteriorates and the lighting apparatus becomes large in size. In contrast, if the external shape of the LED light source apparatus is circular as in the LED light source apparatus 1 of the present invention, the LED light source apparatus 1 can be installed inside the supporting portion 32 of the lighting apparatus 30 without any wasted space being provided, thereby enabling effective use of space, as shown in FIG. 9B. As a result, the widest possible area is secured for the base 2, which functions as a heat dissipation plate, and for the heat sink 27, which is configured to increase the heat dissipation effect, whereby a high brightness high output lighting apparatus can be obtained which is both compact and excels in heat dissipation characteristics.

Further, since the external shape of the LED light source apparatus 1 is circular, it can be easily installed in a bulb-shaped lighting apparatus, thereby enabling realization of a lighting apparatus having a simple structure. Moreover, since the LED light source apparatus 1 of the present invention, at the same time as having a circular external shape, also has the mounting area 14 and the light emitting area 21 being circular, the emission light is emitted as a substantially circular emitted light pattern and optical design of the lens and so on are rendered easily performable.

Furthermore, since the emitted light pattern of the emission light is substantially circular, there is almost no change in the emitted light pattern whatever the angle of rotation at which the LED light source apparatus 1 is installed in the lighting apparatus, whereby a lighting apparatus can be provided having a small variation in light emitting characteristics.

Preferred embodiments of the present invention have been described, but the present invention is not limited to these embodiments and it should be understood that various alterations and modifications may be made to the embodiments.

As mentioned above, the LED light source apparatus in accordance with the present invention allows an LED light source apparatus of high lumen density to be realized by a simple design, and can be widely used as a light source apparatus for lighting in such as light sources for general lighting or backlights, and vehicle-mounted light sources.

What is claimed is:

1. A light-emitting diode light source apparatus, comprising:
    a base including an upper surface, a lower surface opposite the upper surface, and a peripheral edge side surface provided between edges of the upper surface and the lower surface, the base having thermal conductivity; and
    a substrate including an upper surface provided with at least one pair of electrode patterns, a lower surface opposite the upper surface, and a pass-through hole provided to pass through the upper surface and the lower surface, the lower surface of the substrate attached to the upper surface of the base,
    the base, the substrate, and the pass-through hole of the substrate each having a concentric circular shape,
    at least one circular mounting area that is an exposed portion of the upper surface of the base exposed from the pass-through hole of the substrate, and
    a plurality of light-emitting diode elements mounted on the circular mounting area of the base, the plurality of light-emitting diode elements electrically connected to the electrode patterns provided on the upper surface of the substrate.

2. The light-emitting diode light source apparatus according to claim 1, wherein
    at least a portion of the electrode patterns is formed in a ring shape that is concentric with the substrate.

3. The light-emitting diode light source apparatus according to claim 1, the electrode patterns comprises:
    a first electrode disposed to surround the circular mounting area and having a ring shape;
    a second electrode disposed to surround the first electrode and having a ring shape with a gap in a middle of the ring shape;
    a third electrode disposed to surround the second electrode and having a ring shape with a gap in a middle of the ring shape, the third electrode electrically connected to the second electrode; and
    a fourth electrode disposed to surround the third electrode and having a ring shape, the fourth electrode electrically connected to the first electrode.

4. The light-emitting diode light source apparatus according to claim 3, wherein
    the first electrode and the fourth electrode each have the ring shape concentric with the base, the substrate, and the pass-through hole of the substrate,
    the second electrode and the third electrode each have the ring shape with the gap, the ring shape concentric with the base, the substrate, and the pass-through hole of the substrate, and
    the electrode patterns further include a connecting electrode that runs through the gaps and electrically connects the first electrode and the fourth electrode.

5. The light-emitting diode light source apparatus according to claim 3, wherein
of the plurality of light-emitting diode elements, some light-emitting diode elements are electrically connected in series to the first and second electrodes to configure one of a plurality of units, and
the plurality of the units are disposed in parallel and electrically connected to the first electrode and the second electrode in parallel.

6. The light-emitting diode light source apparatus according to claim 5, wherein
the light-emitting diode elements in each unit are electrically connected by wires and electrically connected to the first and second electrodes by wires.

7. The light-emitting diode light source apparatus according to claim 4, wherein
the plurality of light-emitting diode elements mounted on the mounting area, an entirety of the mounting area, the first electrode, and the second electrode are sealed by a light-transmitting resin in a circular shape in top plan view.

8. The light-emitting diode light source apparatus according to claim 1, further comprising a heat dissipation member that is attached to the lower surface of the base.

9. The light-emitting diode light source apparatus according to claim 5, wherein
the third electrode and the fourth electrode are used for external connection, and the third and fourth electrodes each have a width broader than a width of each of the first electrode and the second electrode.

10. The light-emitting diode light source apparatus according to claim 5, wherein
at least one of the units is shifted with respect to adjacently disposed units.

11. The light-emitting diode light source apparatus according to claim 1, wherein
of the plurality of light-emitting diode elements, adjacently disposed three light-emitting diode elements are disposed with their respective centers positioned at vertexes of a triangle.

12. A lighting apparatus, comprising:
a substantially hemispherical light emitting portion; and
a supporting portion for supporting the light emitting portion, the light-emitting diode light source apparatus recited in claim 1 being disposed within the supporting portion.

* * * * *